United States Patent
Brüderl et al.

(10) Patent No.: US 7,524,737 B2
(45) Date of Patent: Apr. 28, 2009

(54) METHOD OF FABRICATING A SEMICONDUCTOR CHIP WITH A NITRIDE COMPOUND SEMICONDUCTOR MATERIAL

(75) Inventors: Georg Brüderl, Burlengenfeld (DE); Volker Härle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 489 days.

(21) Appl. No.: 11/314,447

(22) Filed: Dec. 20, 2005

(65) Prior Publication Data
US 2006/0172506 A1    Aug. 3, 2006

(30) Foreign Application Priority Data
Dec. 23, 2004    (DE) ......................... 10 2004 062 290

(51) Int. Cl.
*H01L 21/30* (2006.01)
(52) U.S. Cl. ................ 438/458; 438/464; 438/506; 438/E21.568; 438/E21.57
(58) Field of Classification Search ................ None
See application file for complete search history.

(56) References Cited

U.S. PATENT DOCUMENTS

| 5,374,564 | A | | 12/1994 | Bruel |
| 5,502,316 | A | * | 3/1996 | Kish et al. ................ 257/94 |
| 5,882,987 | A | * | 3/1999 | Srikrishnan ................ 438/458 |
| 6,103,597 | A | | 8/2000 | Aspar et al. |
| 6,251,754 | B1 | * | 6/2001 | Ohshima et al. ............ 438/506 |
| 6,559,075 | B1 | | 5/2003 | Kelly et al. |
| 6,794,276 | B2 | * | 9/2004 | Letertre et al. ............ 438/506 |
| 6,893,936 | B1 | * | 5/2005 | Chen et al. ................ 438/407 |
| 6,953,736 | B2 | * | 10/2005 | Ghyselen et al. ........... 438/458 |
| 7,265,029 | B2 | * | 9/2007 | Letertre et al. ............ 438/458 |
| 7,348,260 | B2 | * | 3/2008 | Ghyselen .................. 438/458 |
| 2003/0064535 | A1 | | 4/2003 | Kub et al. |
| 2004/0256632 | A1 | | 12/2004 | Stein et al. |
| 2008/0128751 | A1 | * | 6/2008 | Langdo et al. ............. 257/191 |

FOREIGN PATENT DOCUMENTS

| DE | 199 59 182 A1 | 6/2001 |
| DE | 103 50 707 A1 | 11/2004 |
| DE | 10 2004 030 063 A1 | 2/2005 |
| DE | 10 2004 030 603 | 2/2005 |
| WO | WO 98/14986 | 4/1998 |
| WO | WO 99/41776 | 8/1999 |
| WO | WO 2004/061943 A1 | 7/2004 |

OTHER PUBLICATIONS

European Search Report for corresponding European Application No. EP 05 02 6485.

* cited by examiner

*Primary Examiner*—Alonzo Chambliss
(74) *Attorney, Agent, or Firm*—Cohen Pontani Lieberman & Pavane LLP

(57) ABSTRACT

In a process for producing a semiconductor chip, a functional semiconductor layer sequence (2) is grown epitaxially on a growth substrate (1). Then, a separating zone (4), which lies parallel to a main surface (8) of the growth substrate (1), is formed in the growth substrate (1) by ion implantation, the ion implantation taking place through the functional semiconductor layer sequence (2). Then, a handle substrate (6) is applied to the functional semiconductor layer sequence (2), and a part of the growth substrate (1) which is remote from the handle substrate (6) as seen from the separating zone (4), is detached along the separating zone (4).

14 Claims, 2 Drawing Sheets

METHOD OF FABRICATING A SEMICONDUCTOR CHIP WITH A NITRIDE COMPOUND SEMICONDUCTOR MATERIAL

RELATED APPLICATION

This patent application claims the priority of German patent application no. 10 2004 062 290.6 filed Dec. 23, 2004, the disclosure content of which is hereby incorporated by reference.

FIELD OF THE INVENTION

The invention relates to a process for producing a semiconductor chip, in particular an optoelectronic semiconductor chip which has an epitaxially produced functional semiconductor layer sequence.

BACKGROUND OF THE INVENTION

Semiconductor components based on nitride compound semiconductors are predominantly used in optoelectronics, in particular for generating radiation in the ultraviolet, blue and green spectral regions. In the text which follows, the term "based on nitride semiconductors" means that a component or part of a component described in this way preferably comprises $In_xAl_yGa_{1-x-y}N$, where $0 \leq x \leq 1$, $0 \leq y \leq 1$ and $x+y \leq 1$. This material does not necessarily have to have a composition which is mathematically precise according to the above formula. Rather, it may include one or more dopants and additional constituents which leave the physical properties of the material substantially unchanged. For the sake of simplicity, however, the above formula only includes the main constituents of the crystal lattice (Al, Ga, In, N), even though these constituents may be partially replaced by small quantities of further substances.

Epitaxy processes are usually used to produce semiconductor components based on nitride compound semiconductors. Since a reduction in the defect density in the nitride compound semiconductor is one of the main preconditions for increasing the internal efficiency of optoelectronic semiconductor chips based on nitride compound semiconductors, it is desirable to use a growth substrate which, like the layer sequence which is to be epitaxially grown, is formed from a nitride compound semiconductor. However, substrates made from a nitride compound semiconductor, in particular GaN, can only be produced at high technical cost and are therefore considerably more expensive than the alternative substrates made from SiC and sapphire which are customarily used.

A known process for producing optoelectronic components based on nitride compound semiconductors is based on what is known as thin-film technology. In this technology, a functional semiconductor layer sequence is first of all grown epitaxially on a growth substrate, then a new handle is applied to the opposite surface of the semiconductor layer sequence from the growth substrate, and then the growth substrate is detached. This has the advantage in particular that the growth substrate can be reused. The detaching of a sapphire growth substrate from a semiconductor layer sequence comprising a nitride compound semiconductor can be carried out, for example using a laser lift-off method which is known from U.S. Pat. No. 6,559,075. However, this process cannot readily be applied to substrates made from a nitride compound semiconductor.

SUMMARY OF THE INVENTION

One object of the present invention is to provide an improved process for producing a semiconductor chip, preferably an optoelectronic semiconductor chip based on a nitride compound semiconductor. It should advantageously be possible to reuse the growth substrate, and the production costs should be relatively low.

This and other objects are attained in accordance with one aspect of the present invention directed to a process for producing a semiconductor chip. A growth substrate is provided and then a functional semiconductor layer sequence is grown on the growth substrate. Then, a separating zone, which lies parallel to a main surface of a growth substrate, is formed in the growth substrate by ion implantation, the ion implantation taking place through the functional semiconductor layer sequence. Then, a handle substrate is applied to the functional semiconductor layer sequence. Finally, in a further process step, a part of the growth substrate which is remote from the handle substrate as seen from the separating zone is detached along the separating zone.

After the process step of detaching along the separating zone, the growth substrate can advantageously be used for the production of further optoelectronic components. This reduces manufacturing costs.

Since the ion implantation into the growth substrate only takes place after the epitaxial growth of the functional semiconductor layer sequence on the growth substrate, it is ensured that the quality of the epitaxially grown layers is not adversely affected by deficiencies in the surface of the growth substrate. Deficiencies of this nature may otherwise occur if the ion implantation were to take place prior to the application of the functional semiconductor layer sequence.

Suitable lattice matching of the epitaxially grown layers to the growth substrate advantageously reduces the defect density in the epitaxially grown functional semiconductor layer sequence. The growth substrate and the functional semiconductor layer sequence preferably have substantially the same lattice constant. It is particularly preferable for the growth substrate and the functional semiconductor layer sequence to be based on the same semiconductor material. In particular, there is provision for the growth substrate and the functional semiconductor layer sequence each to be formed from a nitride compound semiconductor material. The term nitride compound semiconductor encompasses in particular $In_xAl_yGa_{1-x-y}N$, where $0 \leq x \leq 1$, $0 \leq y \leq 1$ and $x+y \leq 1$. This material does not necessarily have to have a composition which is mathematically precisely according to the above formula. Rather, it may include one or more dopants and additional constituents which leave the physical properties of the material substantially unchanged. For the sake of simplicity, however, the above formula only includes the main constituents of the crystal lattice (Al, Ga, In, N), even though these constituents may be partially replaced by small quantities of further substances.

Detaching of the growth substrate along the separating zone can be effected by thermally blasting it away. One way in which the formation of a separating zone by ion implantation and the thermal blasting-away of a part of the substrate is known in principle from documents U.S. Pat. Nos. 5,374,564 and 6,103,597, and is therefore not explained in more detail at this point.

In a preferred embodiment of the invention, the functional epitaxial semiconductor layer sequence includes a radiation-emitting active layer which in particular includes $In_xAl_yGa_{1-x-y}N$, where $0 \leq x \leq 1$, $0 \leq y \leq 1$ and $x+y \leq 1$.

The ion implantation is preferably followed by thermal annealing of the epitaxial functional semiconductor layer sequence, in order to reduce possible impairment of the layer quality which could occur as a result of the ion implantation taking place through the functional semiconductor layer sequence. In particular, the subsequent annealing of the functional semiconductor layer sequence advantageously entails less technical outlay than remachining of the growth substrate by grinding or etching, which would be necessary in the event of ion implantation prior to the growth of the functional semiconductor layer sequence to produce a surface suitable for the epitaxy. The thermal annealing does not have to take place immediately after the ion implantation, but rather may in particular also take place only after the part of the growth substrate has been detached, for example if thermal blasting-away were to take place at a lower temperature than the temperature required for the annealing process.

Prior to the application of the handle substrate, the epitaxial semiconductor layer sequence is preferably provided with an electrical contact layer or with a contact layer sequence which comprises a plurality of individual layers. The electrical contact layer or contact layer sequence can be reflecting or comprises a reflecting layer. This is especially advantageous for radiation-emitting optoelectronic semiconductor chips, since the reflecting layer reflects radiation emitted in the direction of the handle substrate back toward a radiation discharge surface lying opposite the handle substrate, therefore preventing absorption in the handle substrate.

The growth substrate can be a GaN substrate or an AlN substrate. The growth substrate can be n-doped.

The hydrogen ions can be implanted in the growth substrate during the ion implantation. Alternatively, it is also possible to use ions of noble gases, such as for example helium, neon, krypton or xenon.

The handle substrate advantageously has a coefficient of thermal expansion which is matched to the coefficient of thermal expansion of the functional semiconductor layer sequence based on a nitride compound semiconductor. This has the advantage that damage to the functional semiconductor layer sequence by mechanical stresses, which could occur with very different coefficients of thermal expansion of the functional semiconductor layer sequence and the handle substrate in particular during heating of the semiconductor chip as required for thermally blasting away the growth substrate, is prevented.

Particularly suitable materials for the handle substrate include Ge, GaAs, metals, such as for example Mo or Au, or metal alloys based on Au or Mo. The handle substrate is preferably applied to the functional semiconductor layer sequence, or if appropriate to the contact layer or layer sequence, by means of soldering or bonding. It is in particular possible to use bonding processes such as wafer bonding, eutectic bonding or oxidic bonding.

The process according to the invention is preferably used to produce optoelectronic semiconductor chips, in particular for luminescence diodes and semiconductor laser components. Alternatively, it can be used for the production of other electronic components.

DETAILED DESCRIPTION OF THE DRAWINGS

Figure 1:
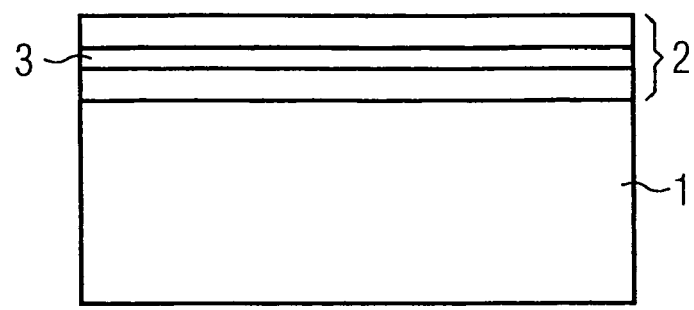
FIGS. 1 to 6 each show diagrammatically depicted cross sections through an optoelectronic semiconductor chip during intermediate steps of an exemplary embodiment of the process according to the invention.

Identical or equivalent components are denoted by the same reference numerals throughout the figures.

In the intermediate step of an exemplary embodiment of a process according to the invention illustrated in FIG. 1, a functional semiconductor layer sequence 2, which is based on a nitride compound semiconductor, has been applied to a growth substrate 1 consisting of a nitride compound semiconductor. As used herein, the term "functional semiconductor layer sequence" refers to a layer sequence that includes at least one layer (a "functional layer") which is essential to the function of a semiconductor device, such as the active region in a radiation emitting optoelectronic device. The growth substrate 1 may in particular be a GaN substrate or an AlN substrate. The growth substrate 1 is preferably an n-doped substrate. The functional semiconductor layer sequence 2 may, in particular include a radiation-emitting active zone 3 which contains, for example $In_xAl_yGa_{1-x-y}N$, where $0 \leq x \leq 1$, $0 \leq y \leq 1$ and $x+y \leq 1$. The functional semiconductor layer sequence 2 is applied, for example, by means of metallorganic vapor phase epitaxy (MOVPE) or another epitaxial production process.

Figure 2:
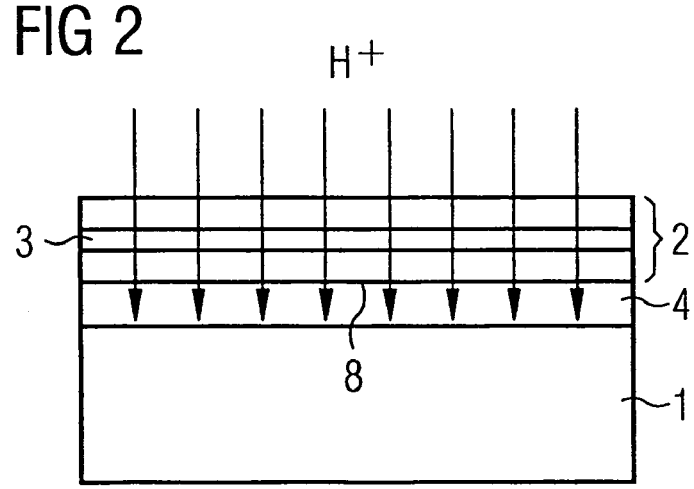

In the intermediate step illustrated in FIG. 2, a separating zone 4 running parallel to a main surface 8 of the growth substrate 1 is formed in the growth substrate 1 by implantation of H+ ions. The $H^+$ ions are implanted into the growth substrate 1 through the functional semiconductor layer sequence 2 which includes, for example, the active layer 3. The ion implantation is preferably followed by a heat treatment of the functional semiconductor layer sequence 2, in order to reduce the damage to the functional semiconductor layer sequence 2 which may be caused by the high-energy ions.

Figure 3:
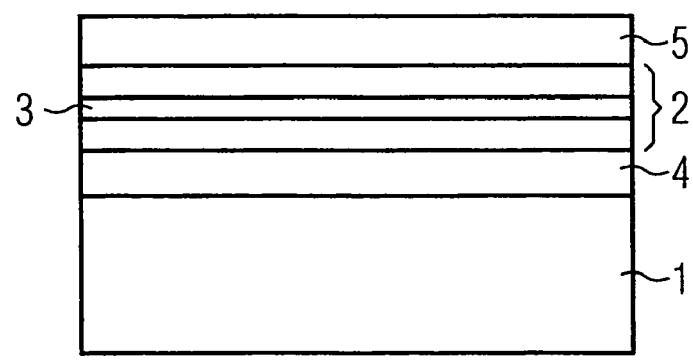

In the intermediate step illustrated in FIG. 3, a contact layer 5 was applied to the functional semiconductor layer sequence 2. The contact layer 5 preferably reflects the radiation emitted from the radiation-emitting active zone 3. In particular, the contact layer 5 may also be of multilayer design, in which case it preferably comprises a reflecting layer, which contains, for example Au, AuGe, Ag, Al or another metal or another metal compound, on a side facing the functional semiconductor layer sequence 2. Contact layers of this type are known, for example from published U.S. published patent application no. 2004/0256632 A1, and are therefore not explained in more detail at this point.

Figure 4:
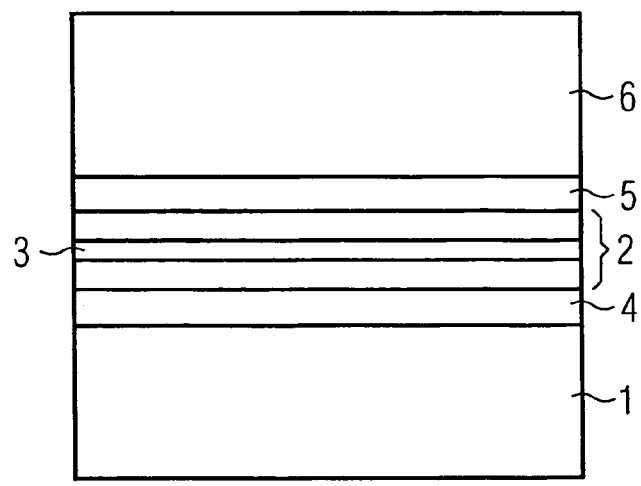

In the intermediate step of the process according to the invention illustrated in FIG. 4, a handle substrate 6 has been applied to the semiconductor layer sequence 2 provided with the contact layer 5. It is preferable for the handle substrate 6 to be applied by bonding or soldering. The handle substrate 6 advantageously substantially comprises Ge, GaAs, Mo or Au. These materials have the advantage of their coefficient of thermal expansion being well matched to the coefficient of thermal expansion of the functional semiconductor layer sequence 2 which is based on a nitride compound semiconductor. As a result, mechanical stresses between the handle substrate 6 and the semiconductor layer sequence 2 during the subsequent process step of thermally blasting away the growth substrate 1, during which the semiconductor chip has to be strongly heated, are advantageously reduced, thereby counteracting the formation of cracks and/or detachment of the handle substrate 6 from the semiconductor layer sequence 2.

Figure 5:
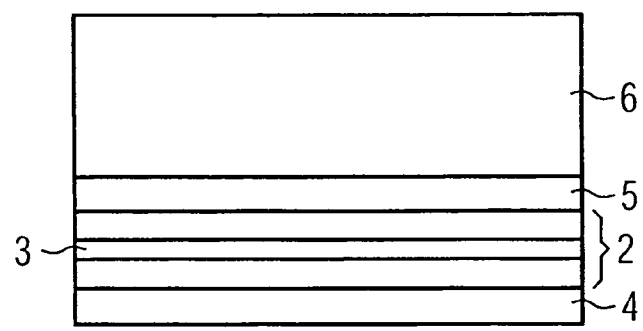

In the intermediate step illustrated in FIG. 5, that part of the growth substrate 1 which lies on the side of the separating zone 4 remote from the handle substrate 6 has been thermally blasted off, for example by heating to a temperature of approximately 300° C. to 700° C. It should be noted that the growth substrate is not destroyed when it is detached from the semiconductor chip by thermally blasting it off. Therefore, the growth substrate can be reused after it has been detached. However, a part of separating zone 4 is destroyed during the blasting off of the growth substrate. Therefore, only thin layer of the separating zone 4 remains on the semiconductor layer sequence 2. The thickness of the separating zone 4 which remains joined to the functional semiconductor layer sequence 2 after the original growth substrate 1 has been blasted away can be reduced by selecting the energy of the hydrogen ions during the ion implantation in such a manner that the maximum distribution of these hydrogen ions occurs as close as possible to the interface between the original growth substrate 1 and the functional semiconductor layer sequence 2.

Figure 6:
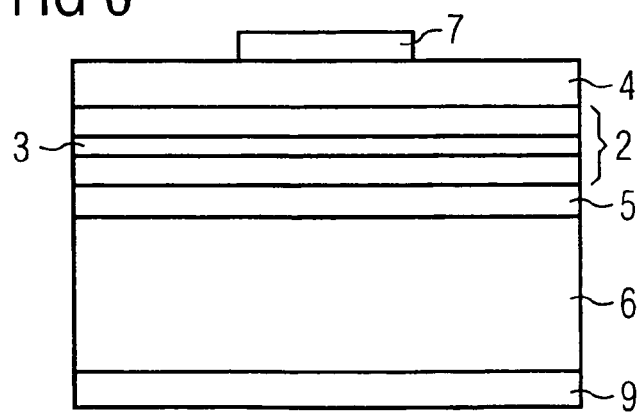

In the intermediate step illustrated in FIG. 6, a first contact metallization 6, which preferably forms the n-contact of the semiconductor chip, has been applied to that side of the semiconductor chip which is remote from the handle substrate 6, and a second contact metallization 9, which preferably forms the p-contact of the semiconductor chip, has been applied to that side of the handle substrate 6 which is remote from the semiconductor layer sequence 2. Of course, the reverse polarity may also be present, and it is also possible to use other contact-connection techniques known to the person skilled in the art. In particular, the handle substrate 6 does not have to be electrically conductive, but rather it is also possible for both the n-contact and the p-contact to be provided on that side of the handle substrate 6 which faces the semiconductor layer sequence 2.

The description of the process based on the intermediate steps shown in FIGS. 1 to 6 can of course be supplemented by further process steps. By way of example, the functional semiconductor layer sequence 2 may even be patterned into a plurality of individual semiconductor layer steps prior to the application of the handle substrate 6. After the handle substrate 6 has been applied, the plurality of semiconductor layer stacks can then for example be divided into individual semiconductor chips, by sawing or breaking.

The invention is not restricted by the description based on the exemplary embodiments. Rather, the invention encompasses every new feature and every combination of features, which in particular includes every combination of features in the patent claims, even if this feature or this combination is not itself explicitly mentioned in the patent claims or exemplary embodiments.

We claim:

1. A process for producing a semiconductor chip which has an epitaxially produced functional semiconductor layer sequence, the process comprising the following process steps:
   providing a growth substrate;
   epitaxially growing the functional semiconductor layer sequence on the growth substrate;
   forming a separating zone, which lies parallel to a main surface of the growth substrate, in the growth substrate by ion implantation, said ion implantation into the growth substrate occurring subsequent to the epitaxial growth and occurring through the functional semiconductor layer sequence;
   applying a handle substrate to the functional semiconductor layer sequence; and
   detaching a part of the growth substrate which is remote from the handle substrate as seen from the separating zone, along the separating zone;
   wherein the functional semiconductor layer sequence includes a radiation-emitting active layer which comprises $In_xAl_yGa_{1-x-y}N$, where $0 \leq x \leq 1$, $0 \leq y \leq 1$ and $x+y \leq 1$.

2. The process as claimed in claim 1, wherein the growth substrate and the functional semiconductor layer sequence have substantially the same lattice constant.

3. The process as claimed in claim 1, wherein the growth substrate and the functional semiconductor layer sequence are based on the same semiconductor material.

4. The process as claimed in claim 3, wherein the growth substrate and the functional semiconductor layer sequence are each formed from a nitride compound semiconductor material.

5. The process as claimed in claim 1, wherein the growth substrate is a GaN substrate or an AlN substrate.

6. The process as claimed in claim 1, wherein the detaching of that part of the growth substrate that is remote from the handle substrate as seen from the separation zone, along the separation zone is effected by it being thermally blasted off.

7. The process as claimed in claim 1, wherein the growth substrate is an electrically conductive substrate, in particular an n conducting substrate.

8. The process as claimed in claim 1, wherein the handle substrate is an electrically conductive substrate, in particular a p conducting substrate.

9. The process as claimed in claim 1, wherein hydrogen ions are implanted during the ion implantation.

10. The process as claimed in claim 1, wherein the ion implantation is followed by thermal annealing of the functional semiconductor layer sequence.

11. The process as claimed in claim 1, wherein the functional semiconductor layer sequence is provided with an electrical contact layer or contact layer sequence before the handle substrate is applied.

12. The process as claimed in claim 11, wherein the functional semiconductor layer sequence comprises a radiation-emitting active layer, and the electrical contact layer serves as a reflector for the emitted radiation.

13. A process for producing a semiconductor chip which has an epitaxially produced functional semiconductor layer sequence, the process comprising the following process steps:
   providing a growth substrate;
   epitaxially growing the functional semiconductor layer sequence on the growth substrate;
   forming a separating zone, which lies parallel to a main surface of the growth substrate, in the growth substrate by ion implantation, the ion implantation into the growth substrate occurring subsequent to the epitaxial growth and occurring through the functional semiconductor layer sequence;
   applying a handle substrate to the functional semiconductor layer sequence; and
   detaching a part of the growth substrate which is remote from the handle substrate as seen from the separating zone, along the separating zone;
   wherein the growth substrate and the functional semiconductor layer sequence are each formed from a nitride compound semiconductor material.

14. A process for producing a semiconductor chip which has an epitaxially produced functional semiconductor layer sequence, the process comprising the following process steps:

providing a growth substrate;

epitaxially growing the functional semiconductor layer sequence on the growth substrate;

forming a separating zone, which lies parallel to a main surface of the growth substrate, in the growth substrate by ion implantation, the ion implantation into the growth substrate occurring subsequent to the epitaxial growth and occurring through the functional semiconductor layer sequence;

applying a handle substrate to the functional semiconductor layer sequence; and detaching a part of the growth substrate which is remote from the handle substrate as seen from the separating zone, along the separating zone;

wherein the functional semiconductor layer sequence is provided with an electrical contact layer or contact layer sequence before the handle substrate is applied.

* * * * *